United States Patent
Kobayashi

(10) Patent No.: US 8,356,406 B2
(45) Date of Patent: Jan. 22, 2013

(54) ELECTRONIC DEVICE AND METHOD OF MANUFACTURING SAME

(75) Inventor: Hiroshi Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1426 days.

(21) Appl. No.: 11/983,931

(22) Filed: Nov. 13, 2007

(65) Prior Publication Data

US 2009/0114435 A1 May 7, 2009

(30) Foreign Application Priority Data

Jan. 18, 2007 (JP) ................................ 2007-009261

(51) Int. Cl.
*H05K 3/30* (2006.01)

(52) U.S. Cl. ............... 29/832; 29/825; 29/829; 29/854; 156/153; 156/154

(58) Field of Classification Search .................. 174/260, 174/259, 255, 250; 361/737, 757, 760, 807, 361/811; 29/603.15, 603.16, 623, 832, 841, 29/842, 854, 855, 603.06, 825, 829; 438/118, 438/106, 126, 63; 156/153, 154, 278; 257/783
See application file for complete search history.

(56) References Cited

U.S. PATENT DOCUMENTS

| | | | | |
|---|---|---|---|---|
| 4,827,328 | A * | 5/1989 | Ozawa et al. | 361/765 |
| 5,987,744 | A * | 11/1999 | Lan et al. | 29/852 |
| 6,058,021 | A * | 5/2000 | Yamamoto | 361/783 |
| 6,117,059 | A | 9/2000 | Besuyen et al. | |
| 6,286,207 | B1 * | 9/2001 | Oura et al. | 29/846 |
| 6,303,873 | B1 * | 10/2001 | Mori et al. | 174/260 |
| 6,353,420 | B1 * | 3/2002 | Chung | 343/895 |
| 6,421,013 | B1 * | 7/2002 | Chung | 343/700 MS |
| 6,512,184 | B1 * | 1/2003 | Yamada et al. | 174/259 |
| 6,591,495 | B2 * | 7/2003 | Hirose et al. | 29/846 |
| 6,664,645 | B2 | 12/2003 | Kawai | |

(Continued)

FOREIGN PATENT DOCUMENTS

| | | |
|---|---|---|
| CN | 1531044 | 9/2004 |
| CN | 1790391 | 6/2006 |

(Continued)

OTHER PUBLICATIONS http://www.daisho-denshi.co.jp/jp/Products_Page/magic_resin_carrier.htm#mrs.

(Continued)

*Primary Examiner* — Angel R Estrada
*Assistant Examiner* — Dimary Lopez
(74) *Attorney, Agent, or Firm* — Fujitsu Patent Center

(57) ABSTRACT

A method of manufacturing an electronic device includes: roughening an underside surface of a film made of a resin, opposite to a mounting surface of the film for mounting a circuit chip; forming a conductor pattern on the mounting surface of the film, thereby obtaining a substrate made of the film where the conductor pattern is formed; and attaching a thermoset adhesive to a conductor-pattern-formed surface of the substrate. The method further includes: mounting the circuit chip to be connected to the conductor pattern on the substrate via the thermoset adhesive; clamping the substrate by a heating apparatus having a presser section and a support section, the presser section abutting the circuit chip mounted on the substrate and the support section abutting the underside surface of the roughened film; and fixing the circuit chip to the conductor pattern by heating and hardening the thermoset adhesive using the heating apparatus.

2 Claims, 6 Drawing Sheets

U.S. PATENT DOCUMENTS

| | | | |
|---|---|---|---|
| 6,791,034 B2 * | 9/2004 | Suzumura et al. | 174/252 |
| 6,903,463 B1 * | 6/2005 | Takeichi et al. | 257/778 |
| 7,193,328 B2 * | 3/2007 | Suzuki et al. | 257/778 |
| 7,605,021 B2 * | 10/2009 | Kobayashi | 438/118 |
| 7,851,258 B2 * | 12/2010 | Kobayashi | 438/108 |
| 7,868,466 B2 * | 1/2011 | Hashimoto | 257/783 |
| 2005/0194423 A1 | 9/2005 | Okita | |
| 2006/0145867 A1 | 7/2006 | Kikuchi et al. | |
| 2006/0220871 A1 * | 10/2006 | Baba et al. | 340/572.7 |
| 2007/0026317 A1 * | 2/2007 | Mitchell et al. | 429/233 |
| 2008/0036608 A1 * | 2/2008 | Sakama | 340/572.7 |
| 2008/0149371 A1 * | 6/2008 | Schrooten | 174/254 |

FOREIGN PATENT DOCUMENTS

| | | |
|---|---|---|
| JP | 57-128948 | 8/1982 |
| JP | 60-236250 | 11/1985 |
| JP | 2000-140529 | 5/2000 |
| JP | 2001-156110 | 6/2001 |
| JP | 2000-138387 | 5/2003 |
| JP | 2003-141486 | 5/2003 |
| JP | 2003-249529 A | 9/2003 |
| JP | 2003-249532 A | 9/2003 |
| JP | 2003249529 A * | 9/2003 |
| JP | 2005-032944 | 2/2005 |
| JP | 2006-008775 A | 1/2006 |

OTHER PUBLICATIONS

"Japanese Office Action" mailed by JPO and corresponding to Japanese application No. 2007-009261 on Jul. 26, 2011, with English translation.

* cited by examiner

ELECTRONIC DEVICE AND METHOD OF MANUFACTURING SAME

BACKGROUND OF THE INVENTION

1. Field of the Invention

The present invention relates to an electronic device and a method of manufacturing the electronic device and, more particularly, to an electronic device wherein a circuit chip is mounted on a film-like substrate and a method of manufacturing the electronic device.

2. Description of the Related Art

Conventionally, there is widely known an electronic device wherein a circuit chip is mounted on a substrate, such as a printed wiring substrate. This electronic device is used in such applications where it is built into an electronic apparatus to control the apparatus or is operated on a stand-alone basis to exchange information with an external apparatus. As an example of the electronic device, there are known various types of radio frequency identification (RFID) tags for contactlessly exchanging information with an external apparatus as typified by a reader/writer, using radio waves. As a type of these RFID tags, there has been proposed an RFID tag wherein a conductor pattern and an IC chip for radio communication are mounted on a base sheet. It has been conceived to use this type of RFID tag in such a manner that the tag is attached to an article or the like to, for example, identify the article by exchanging information about the article with an external apparatus.

There is a demand to reduce the size and weight of RFID tags and, in particular, to make them thinner, more flexible and less costly. In response to this demand, there has been proposed an RFID tag employing a film made of, for example, a resin material, such as polyethylene-terephthalate (PET), as a material of a substrate on which an IC chip is mounted (For example, see Japanese Patent Laid-Open No. 2001-156110).

FIG. 5 is a schematic view intended to explain a method of manufacturing an RFID tag in a conventional technique.

FIG. 5 sequentially shows in Parts (a) to (d) thereof respective steps for manufacturing an RFID tag.

In order to manufacture an RFID tag, there is first prepared a substrate 91 wherein a conductor pattern 912 functioning as an antenna of the RFID tag is formed on a film 911 made of PET, and then a thermoset adhesive 93p which is hardened by heating is attached onto this substrate 91, as shown in Part (a) of FIG. 5.

Next, as shown in Part (b) of FIG. 5, an IC chip 92 is mounted on the substrate 91 in a part to which the thermoset adhesive 93p has been attached. Bumps 921 to be connected to the conductor pattern 912 are formed on the IC chip 92. As shown in Part (c) of FIG. 5, the IC chip 92 is mounted on the substrate 91 so that the bumps 921 positionally align with the conductor pattern 912.

Next, as shown in Part (d) of FIG. 5, the substrate 91 whereon the IC chip 92 is mounted is clamped by a heating apparatus 8 from both the film 911 side and the IC chip 92 side of the substrate 91, with a supporting stage 82 and a heating head 81 of the heating apparatus 8, respectively. Then, the thermoset adhesive 93p is heated and hardened by the heating head 81 of the heating apparatus 8 abutting on the IC chip 92 side. In this way, the IC chip 92 is fixed to the substrate 91 with the bumps 921 in contact with the conductor pattern 912, thereby completing a small-sized lightweight RFID tag.

However, since the glass transition point of PET, which is the material of the film 911, is approximately 67° C. and, therefore, the upper temperature limit of PET is low, the film 911 is liable to deformation due to heating applied when hardening the thermoset adhesive 93p.

FIG. 6 is a schematic view intended to explain the condition of the substrate in a heating step shown in Part (d) of FIG. 5.

If a heating treatment is carried out with the IC chip 92 mounted on the substrate 91 as shown in Part (a) of FIG. 6, the temperature of the substrate 91 rises and the film 911 becomes deformed, as shown in Part (b) of FIG. 6. If the thermoset adhesive 93p being hardened is fluidized along with the deformation of the film 911, air bubbles occur within the thermoset adhesive 93p and remain as voids 931 even after the thermoset adhesive 93p has hardened. The voids within the hardened thermoset adhesive 93p decrease adhesion strength between the IC chip 92 and the substrate 91, thereby degrading the reliability of the RFID tag.

The problem of reliability degradation due to the occurrence of such voids as described above is not limited to RFID tags but is common to electronic devices wherein a circuit chip is mounted on a film-like substrate.

SUMMARY OF THE INVENTION

The present invention has been made in view of the above circumstances and provides an electronic device having reliability enhanced by suppressing the occurrence of voids and a method of manufacturing the electronic device.

A method of manufacturing an electronic device according to the present invention includes the steps of:

roughening an underside surface of a film made of a resin material, which is opposite to a mounting surface of the film, the mounting surface being a surface on which a circuit chip is to be mounted;

forming a conductor pattern on the mounting surface of the film, thereby obtaining a substrate made of the film on which the conductor pattern is formed;

attaching a thermoset adhesive to a surface of the substrate, on which surface the conductor pattern is formed;

mounting the circuit chip to be connected to the conductor pattern on the substrate via the thermoset adhesive;

clamping the substrate by a heating apparatus having a presser section and a support section for heating the thermoset adhesive, such that the presser section abuts on the circuit chip mounted on the substrate and the support section abuts on the underside surface of the film roughened in the step of roughening; and fixing the circuit chip to the conductor pattern by heating and hardening the thermoset adhesive using the heating apparatus.

In the method of manufacturing an electronic device in accordance with the present invention, the substrate is clamped by the presser section and the support section in the step of heating. At this time, the film is prevented from becoming deformed when being melted by heating since the surface of the film abutting on the support section has been roughened and, therefore, frictional force against the deviational movement of the film increases. Consequently, voids due to film deformation are prevented from being produced within the thermoset adhesive, thereby enhancing the reliability of the electronic device. In addition, manufacturing costs decrease since the production yield of the electronic device improves.

In the method of manufacturing an electronic device according to the present invention, preferably, the support section has a surface abutting on the film and being coarser than the film prior to being roughened in the step of roughening.

As the result of not only the film on the manufactured side but also the surface of the support section of an apparatus on the manufacturing side being roughened, frictional force against the deviational movement of the film increases further, thereby further preventing the film from becoming deformed when being melted by heating.

In addition, in the method of manufacturing an electronic device in accordance with the present invention, preferably, the electronic device is an RFID tag that makes the conductor pattern function as a communications antenna and carries out wireless communication via the conductor pattern using the circuit chip.

In order to meet requirements for miniaturization and flexibility, there is a demand to make thinner the film of RFID tags attached to merchandise or cards when they are in use. The method of manufacturing an electronic device in accordance with the present invention is suitable for the manufacture of RFID tags.

Furthermore, the electronic device in accordance with the present invention includes:

a substrate in which a conductor pattern is formed on a film made of a resin material and a surface of the substrate opposite to a surface whereon the conductor pattern is formed is roughened; and a circuit chip mounted on the substrate via a thermoset adhesive and electrically connected to the conductor pattern.

Since the film of the electronic device in accordance with the present invention has been surface-roughened, the film is prevented from becoming deformed when heating by clamping the film side and the circuit chip side thereof by a heating apparatus in a manufacturing process. Consequently, according to the electronic device of the present invention, reliability increases since there are fewer voids in the thermoset adhesive.

It should be noted here that in the electronic device of the present invention, preferably, the conductor pattern functions as a communications antenna and the circuit chip carries out wireless communication via the conductor pattern.

As heretofore described, according to the present invention, there are realized an electronic device having reliability enhanced by preventing voids from being produced and a method of manufacturing the electronic device.

BRIEF DESCRIPTION OF THE DRAWINGS

Embodiments of the present invention will be described in detail based on the following figures, wherein.

DETAILED DESCRIPTION OF THE INVENTION

Hereinafter, embodiments of the present invention will be described with reference to the accompanying drawings.

Figure 1:
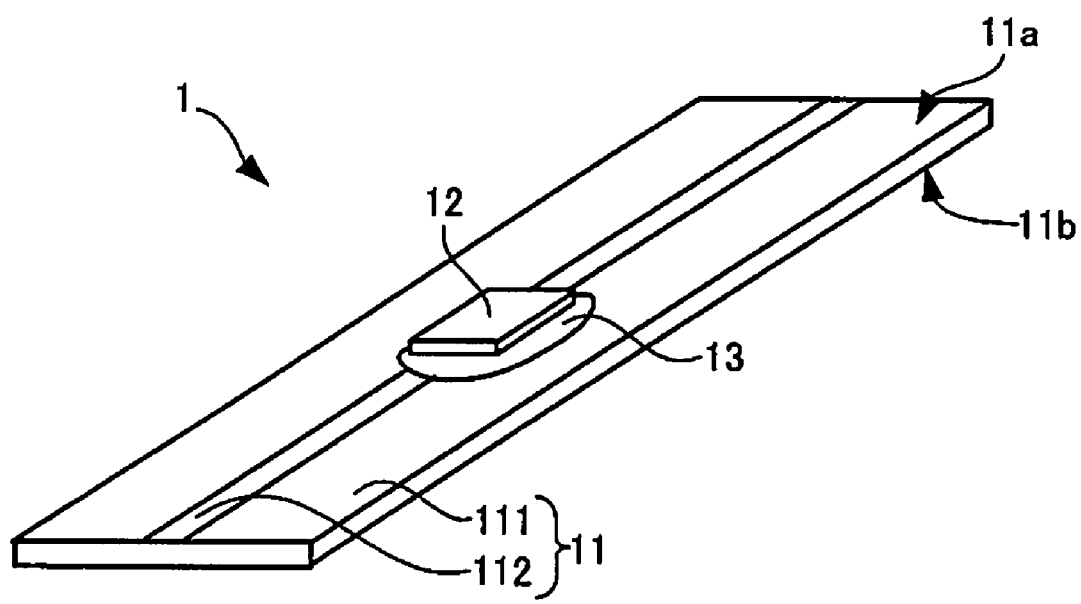
FIG. 1 is a perspective view illustrating an RFID tag in accordance with one embodiment of the present invention.

FIG. 1 is a perspective view illustrating an RFID tag in accordance with one embodiment of the present invention.

The RFID tag 1 shown in FIG. 1 includes a substrate 11 wherein a metal antenna pattern 112 is formed on a film 111 made of a PET material, an IC chip 12 mounted on the substrate 11, and a thermoset adhesive 13 for joining the substrate 11 and the IC chip 12. Of the two surfaces of the substrate 11, an underside surface 11b opposite to a mounting surface 11a on which the IC chip 12 is mounted is surface-roughened as described later.

The RFID tag 1 of the present embodiment is an electronic device which contactlessly exchanges information with a reader/writer not shown in the figure. The RFID tag 1 receives electromagnetic field energy emitted by the reader/writer at the antenna pattern 112 as electric energy by which the IC chip 12 is driven. The antenna pattern 112 functions as a communications antenna and the IC chip 12 carries out wireless communication via the antenna pattern 112.

Note here that the RFID tag 1 corresponds to one example of the electronic device according to the present invention, the antenna pattern 112 corresponds to one example of the conductor pattern according to the present invention, and the IC chip 12 corresponds to one example of the circuit chip according to the present invention.

Also note that the RFID tag used in the present application may be considered as an internal constituent member (inlay) for RFID tags and therefore may, in some cases, be referred to as an inlay for RFID tags among persons skilled in the technical filed of the present application. Alternatively, the RFID tag may be referred to as a wireless IC tag. In addition, a contactless IC card is included in the RFID tag.

Hereinafter, a method of manufacturing the RFID tag 1 will be described.

Figure 2:
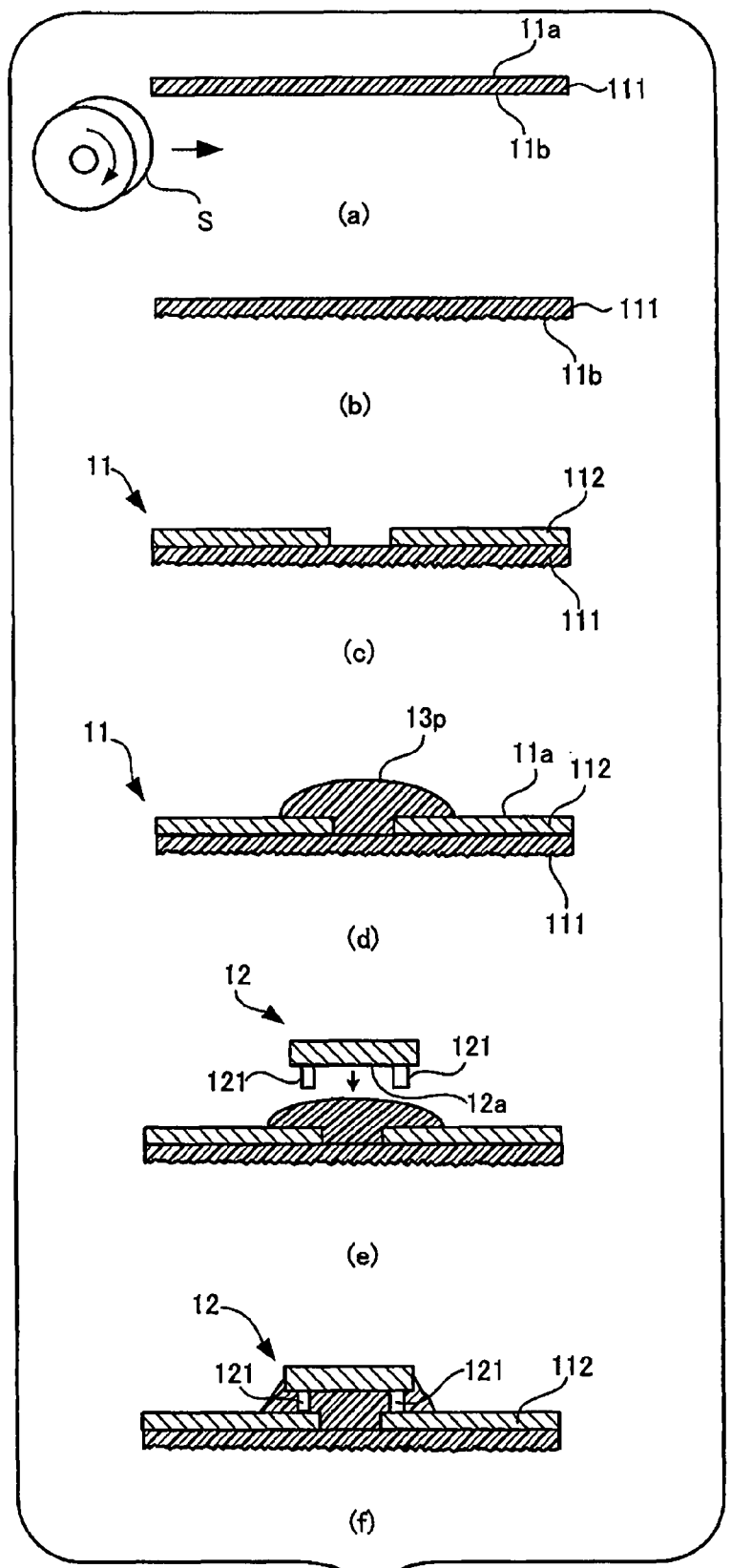
FIG. 2 is a schematic view illustrating a process of manufacturing an RFID tag in accordance with one embodiment of the present invention.
Figure 3:
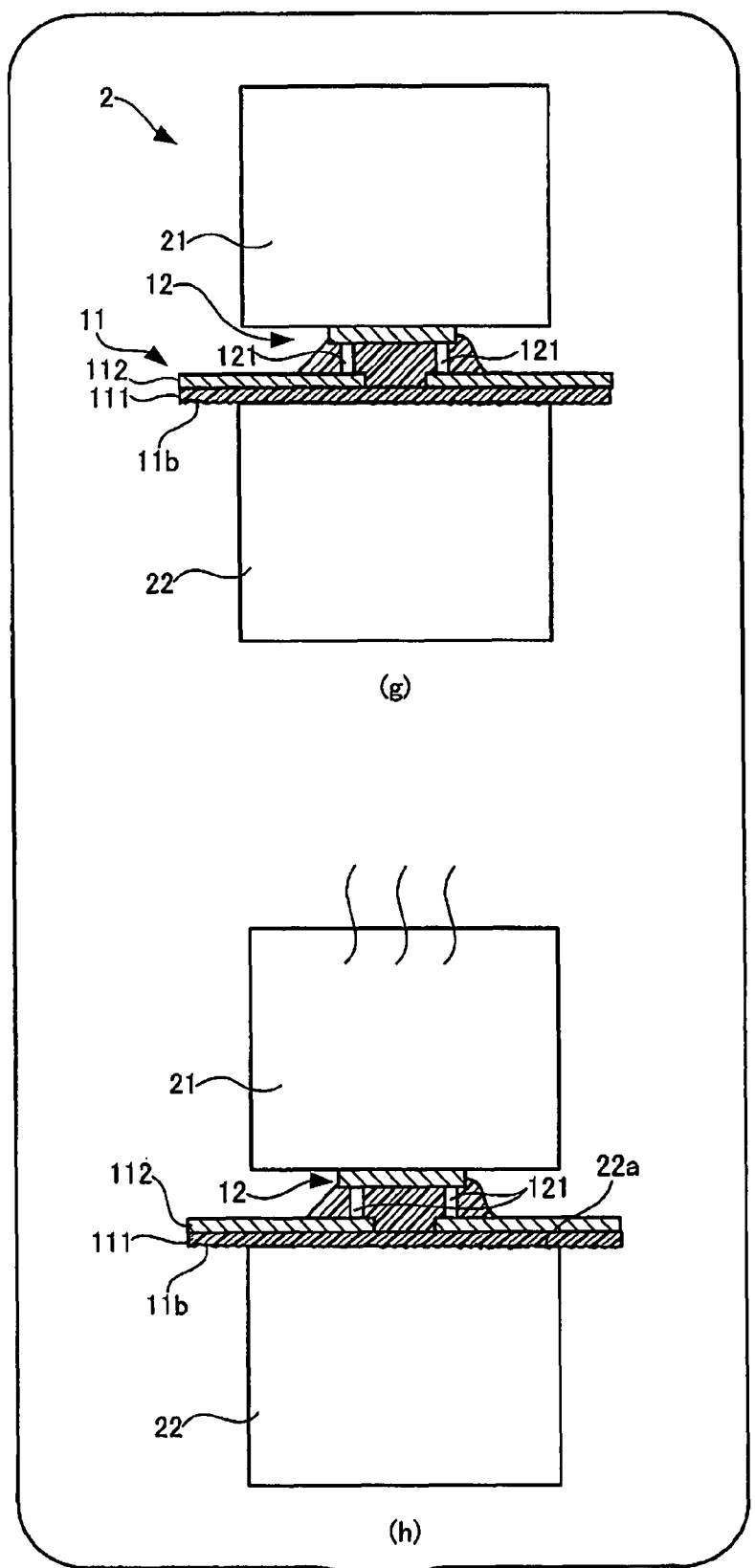
FIG. 3 is a schematic view illustrating a process subsequent to the process illustrated in FIG. 2.

FIGS. 2 and 3 are schematic views illustrating steps of manufacturing an RFID tag in accordance with one embodiment of the present invention.

In FIG. 2, respective steps of manufacturing the RFID tag 1 are sequentially shown in Parts (a) to (f) of the figure, whereas in FIG. 3, steps subsequent to the steps of FIG. 2 are sequentially shown in Parts (g) and (h) of the figure. For ease of viewing the figures, the dimension in the thickness direction of the RFID tag 1 and the IC chip 12 are represented more exaggeratingly than those shown in FIG. 1.

In order to manufacture the RFID tag 1, a film 111 made of a PET material is first prepared in a surface-roughening step shown in Part (a) of FIG. 2, an underside surface 11b opposite to a mounting surface 11a on which an IC chip is to be mounted is mechanically ground using a grinding apparatus S. Thus, the underside surface 11b of the film 111 is surface-roughened as shown in Part (b) of FIG. 2.

Next, in a conductor-forming step shown in Part (c) of FIG. 2, the antenna pattern 112 is formed on the mounting surface 11a of the film 111. While the antenna pattern 112 is formed by forming a copper layer on the film 111 and a resist layer thereon and etching the resist layer, it is also possible to adopt other methods, such as silver paste printing, as a specific method of forming the antenna pattern 112. In the conductor-forming step shown in Part (c) of FIG. 2, there is obtained the substrate 11 wherein the antenna pattern 112 is formed on the film 111 made of a PET material.

Next, in an adhesion step shown in Part (d) of FIG. 2, a thermoset adhesive 13p in liquid form is attached onto the substrate 11. The thermoset adhesive 13p is applied to an area, among the areas of the mounting surface 11a of the substrate 11 whereon the antenna pattern 112 is formed, in which the IC chip 12 is to be mounted and to the periphery of the area.

Next, in a mounting step shown in Parts (e) and (f) of FIG. 2, the IC chip 12 is placed on a part of the substrate 11 to which the thermoset adhesive 13p is attached. The IC chip 12 is mounted on the substrate 11 using a flip-chip technique. That is, the IC chip 12 is mounted on the substrate 11 via the thermoset adhesive 13p, while being positioned so that a surface 12a thereof whereon a circuit is formed faces the substrate 11. On the surface 12a whereon the circuit of the IC chip 12 is formed, there are formed bumps 121 to be connected to the antenna pattern 112. As shown in Part (f) of FIG. 2, the IC chip 12 is mounted on the substrate 11 with the bumps 121 positionally aligned with the antenna pattern 112.

Next, in a clamping step shown in Part (g) of FIG. 2, the substrate 11 whereon the IC chip 12 is mounted is clamped by a heating apparatus 2 from both the film 111 side and the IC chip 12 side of the substrate 11. The heating apparatus 2 has a heating head 21 and a heating stage 22 for clamping the substrate 11. The heating head 21 contains a heater not shown in the figure. In the clamping step, the heating head 21 abuts on the IC chip 12 and the heating stage 22 abuts on the film 111. The heating head 21 corresponds to one example of the presser section according to the present invention, and the heating stage 22 corresponds to one example of the support section according to the present invention.

Figure 4:
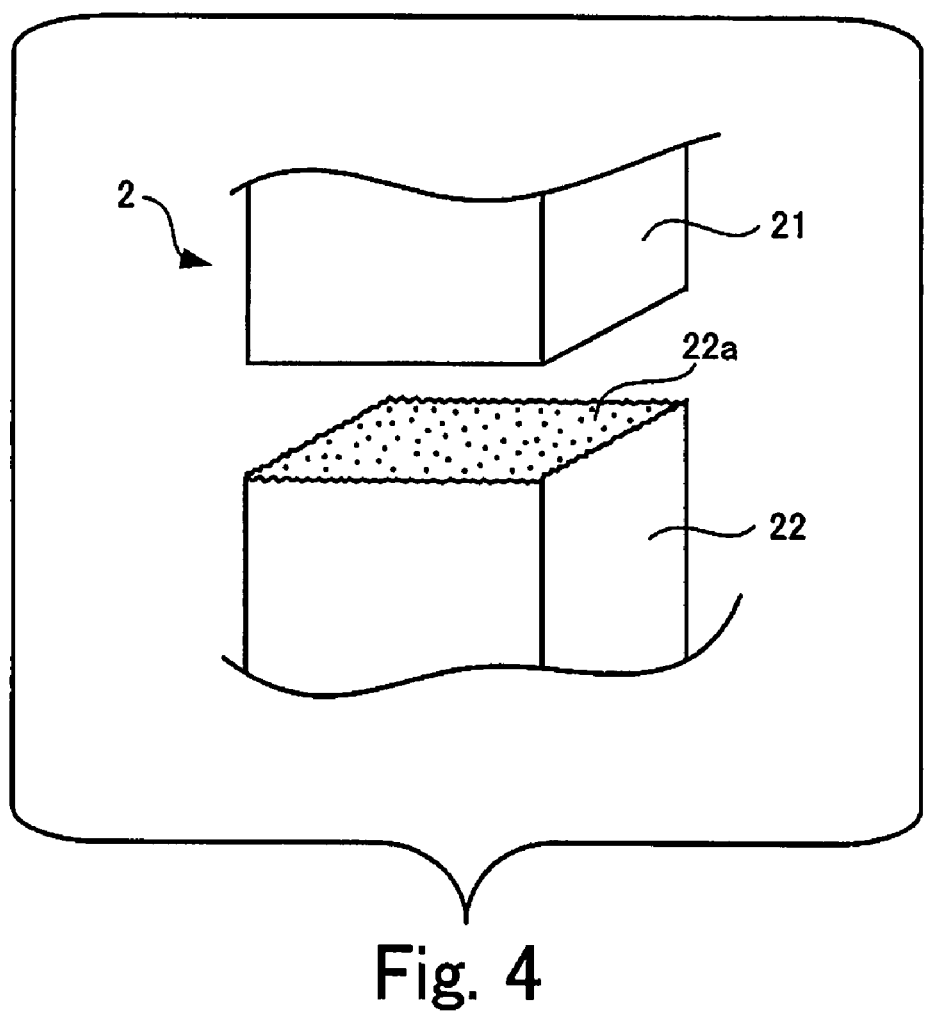
FIG. 4 is a perspective view schematically illustrating a structure of a heating apparatus.
Figure 5:
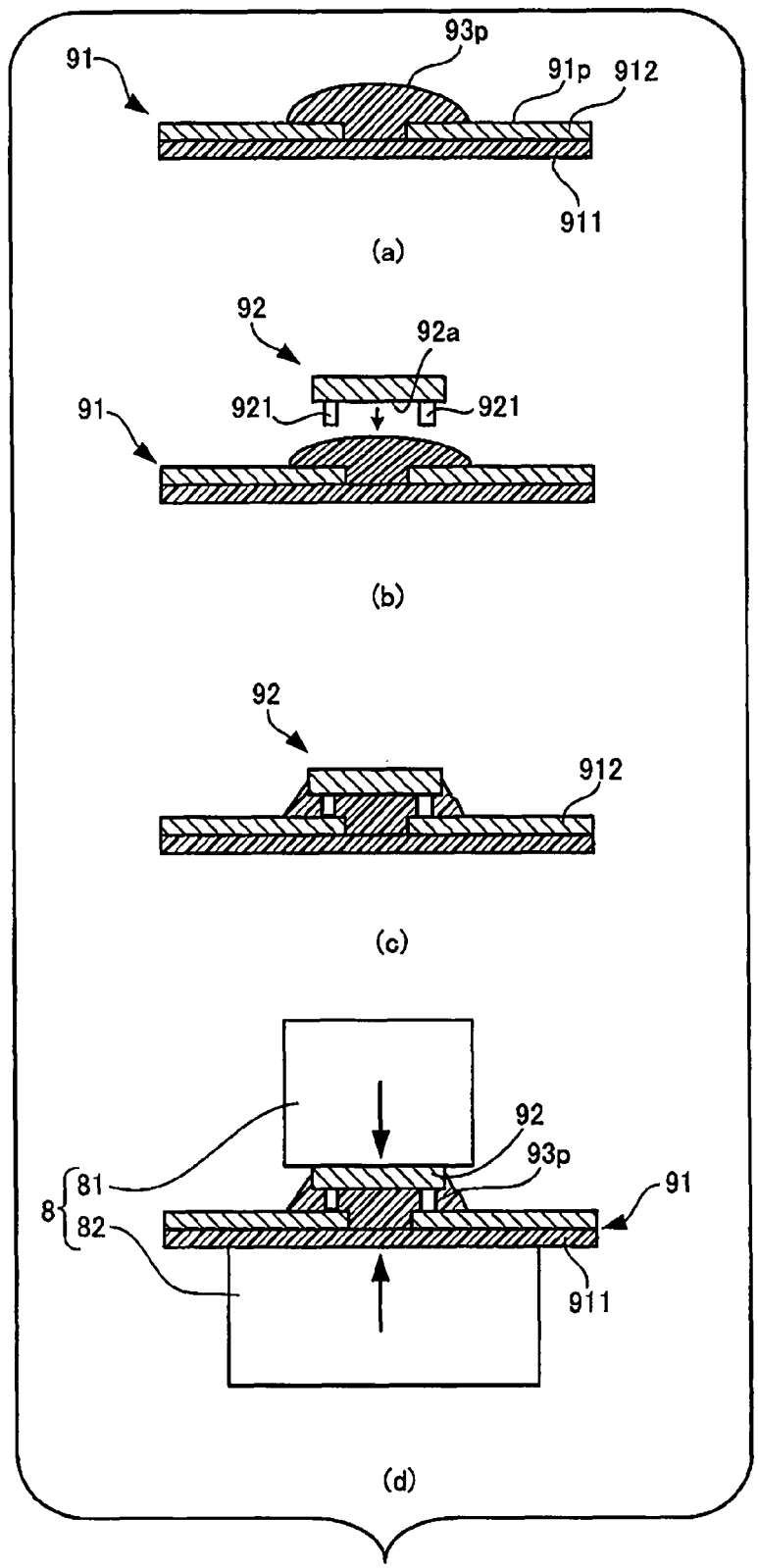
FIG. 5 is a schematic view intended to explain a method of manufacturing an RFID tag in a conventional technique.
Figure 6:
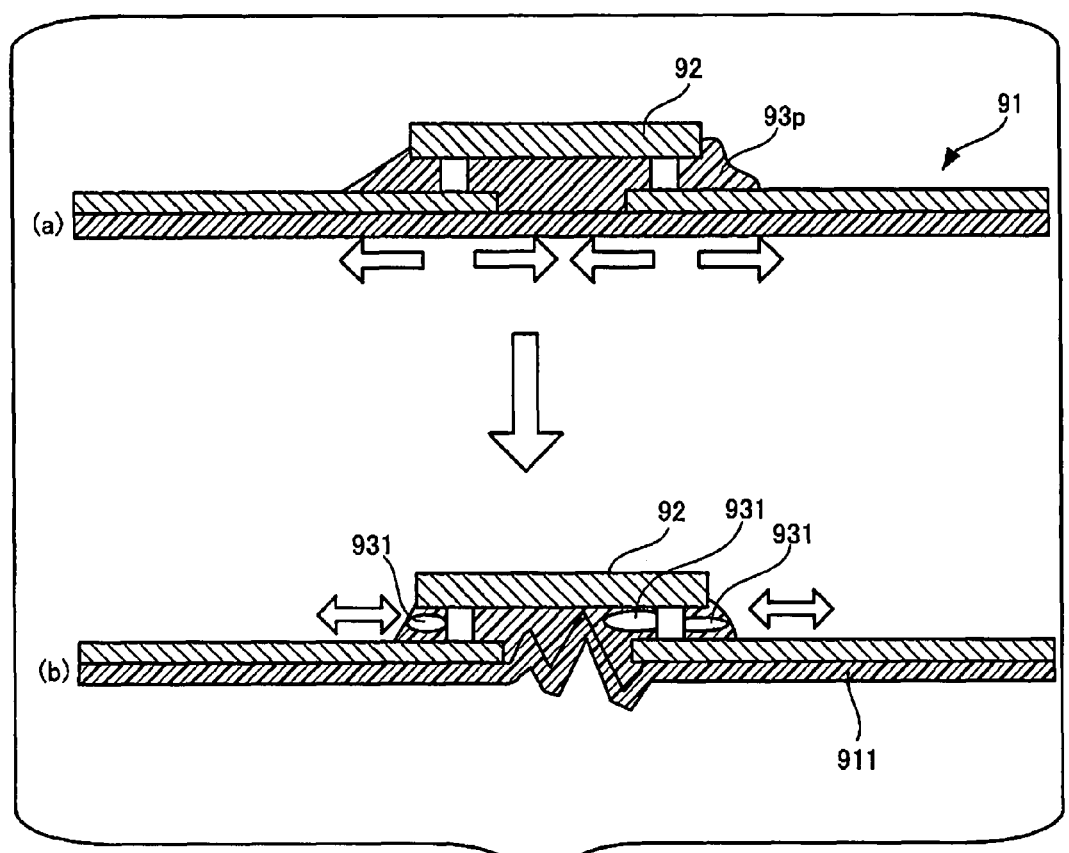
FIG. 6 is a schematic view intended to explain the condition of the substrate in a heating step shown in FIG. 5.

FIG. 4 is a perspective view schematically illustrating a structure of the heating apparatus.

The heating stage 22 that the heating apparatus 2 is provided with is such that a surface 22a thereof abutting on the film 111 is surface-roughened so as to be coarser than the film 111 prior to being subjected to the surface-roughening step shown in Part (a) of FIG. 2.

Referring back to FIG. 3 to continue explanation, the substrate 11 whereon the IC chip 12 is mounted is clamped by the heating stage 22 and the heating head 21 in the clamping step shown in Part (g) of FIG. 3. Consequently, the bumps 121 come into a state of sure contact with the antenna pattern 112.

Next, in the heating step shown in Part (h) of FIG. 3, the heating head 21 is made to generate heat so that the thermoset adhesive 13p is heated and hardened. As the result of the thermoset adhesive 13p being hardened, the IC chip 12 is fixed to the substrate 11 with the bumps 121 in contact with the antenna pattern 112. In this heating step, the underside surface 11b of the surface-roughened film 111 abuts on the heating stage 22. In addition, the surface 22a of the heating stage 22 on which the film 111 abuts is coarser than the underside surface 11b of the film 111 prior to being subjected to the surface-roughening step. Accordingly, there is provided even greater frictional force against the deviational movement of the film 111, thereby preventing the film 111 from becoming deformed even when melted by heating. Accordingly, voids due to film, deformation are prevented from being produced within the thermoset adhesive 13p.

When the heating step shown in Part (h) of FIG. 3 is finished, the RFID tag 1 (see FIG. 1) is completed.

While an explanation has been made of a method of manufacturing an RFID tag and an example of a heating apparatus in the above-described embodiment, the present invention is not limited to a manufacturing method intended for an RFID tag, as long as the method is directed at manufacturing an electronic device wherein a circuit chip is mounted on a film-like substrate. The present invention is also applied to, for example, a method of manufacturing an ultra-thin IC card and a method of manufacturing a printed circuit board device wherein a circuit chip is fixed with a thermoset adhesive onto a flexible printed circuit (FPC) used as a substrate.

Furthermore, while in the above-described embodiment, an explanation has been made on the premise that the underside surface 11b of the film 111 is mechanically ground using the grinding apparatus S in the surface-roughening step, the present invention is not limited to this case. Alternatively, the surface-roughening step may be, for example, such that surface-roughening is carried out by means of treatment in a plasma atmosphere or by means of chemical treatment using chemicals.

In addition, while in the above-described embodiment, an explanation has been made on the premise that the film composing the substrate of the RFID tag is made of a PET material, the film of the electronic device targeted by the present invention is not limited to the PET material but may be made of a material selected from a group consisting of a polyester material, a polyolefin material, a polycarbonate material, an acrylic material, and the like.

While in the above-described embodiment, an explanation has been made on the premise that the presser section of the present invention is combined with a heating source, and that the heating stage does not generate heat, the present invention is not limited to this case. Alternatively, the heating source may be combined with the support section, or may be provided as a part independent of the presser section and the support section.

What is claimed is:

1. A method of manufacturing an electronic device, comprising:
    roughening an underside surface of a film made of a resin material, which is opposite to a mounting surface of the film, the mounting surface being a surface on which a circuit chip is to be mounted;
    forming a conductor pattern on the mounting surface of the film, thereby obtaining a substrate made of the film on which the conductor pattern is formed;
    attaching a thermoset adhesive to a surface of the substrate, on which surface the conductor pattern is formed;
    mounting the circuit chip to be connected to the conductor pattern on the substrate via the thermoset adhesive;
    clamping the substrate by a heating apparatus having a presser section and a support section for heating the thermoset adhesive, such that the presser section abuts on the circuit chip mounted on the substrate and the support section abuts on the underside surface of the film roughened in the roughening; and
    fixing the circuit chip to the conductor pattern by heating and hardening the thermoset adhesive using the heating apparatus, wherein
    the support section has a surface abutting on the film and being coarser than the film prior to being roughened in the roughening so that frictional force against the film is increased by the roughening.

2. The method of manufacturing an electronic device according to claim 1, wherein the electronic device is an RFID tag that makes the conductor pattern function as a communications antenna and carries out wireless communication via the conductor pattern using the circuit chip.

* * * * *